(12) United States Patent
Pulugurtha et al.

(10) Patent No.: US 11,756,985 B2
(45) Date of Patent: Sep. 12, 2023

(54) SUBSTRATE-COMPATIBLE INDUCTORS WITH MAGNETIC LAYERS

(71) Applicants: Georgia Tech Research Corporation, Atlanta, GA (US); NITTO DENKO CORPORATION, Osaka (JP)

(72) Inventors: Markondeya Raj Pulugurtha, Atlanta, GA (US); Yoshihiro Furukawa, Osaka (JP); Himani Sharma, Atlanta, GA (US); Keiji Takemura, Osaka (JP); Rao R. Tummala, Atlanta, GA (US); Teng Sun, Atlanta, GA (US)

(73) Assignees: Georgia Tech Research Corporation, Atlanta, GA (US); NITTO DENKO CORPORATION, Osaka (JP)

( * ) Notice: Subject to any disclaimer, the term of this patent is extended or adjusted under 35 U.S.C. 154(b) by 526 days.

(21) Appl. No.: 16/764,585

(22) PCT Filed: Nov. 16, 2017

(86) PCT No.: PCT/US2017/062026
§ 371 (c)(1),
(2) Date: May 15, 2020

(87) PCT Pub. No.: WO2019/099011
PCT Pub. Date: May 23, 2019

(65) Prior Publication Data
US 2021/0036095 A1    Feb. 4, 2021

(51) Int. Cl.
*H01F 27/24* (2006.01)
*H01L 49/02* (2006.01)
(Continued)

(52) U.S. Cl.
CPC ............ *H01L 28/10* (2013.01); *H01F 27/245* (2013.01); *H01F 27/324* (2013.01); *H01F 27/24* (2013.01); *H01F 27/2871* (2013.01)

(58) Field of Classification Search
CPC ..... H01L 28/10; H01F 27/245; H01F 27/324; H01F 27/2871; H01F 2017/0066;
(Continued)

(56) References Cited

U.S. PATENT DOCUMENTS

| 3,790,407 A | 2/1974 | Merten et al. |
| 4,639,708 A | 1/1987 | Weatherly |

(Continued)

FOREIGN PATENT DOCUMENTS

| CN | 101297382 A | 10/2008 |
| JP | 2001-244123 A | 9/2001 |

(Continued)

OTHER PUBLICATIONS

Office Action, issued by the Japanese Patent Office dated Aug. 3, 2021, in connection with Japanese Patent Application No. 2020-526623.
(Continued)

*Primary Examiner* — Tuyen T Nguyen
(74) *Attorney, Agent, or Firm* — Edwards Neils LLC; Jean C. Edwards, Esq.

(57) ABSTRACT

An exemplary embodiment of the present invention provides a planar inductor including a substrate, a first magnetic layer, a conductive coil, and a second magnetic layer. The first magnetic layer can be disposed on at least a portion of the substrate. The conductive coil can be disposed on a first portion of the first magnetic layer. The second magnetic layer can be disposed on a second portion of the first magnetic layer and on at least a portion of the conductive coil.

30 Claims, 5 Drawing Sheets

(51) Int. Cl.
*H01F 27/245* (2006.01)
*H01F 27/32* (2006.01)
*H01F 27/28* (2006.01)

(58) Field of Classification Search
CPC ...... H01F 2017/048; H01F 1/26; H01F 17/04; H01F 17/0006
See application file for complete search history.

(56) References Cited

U.S. PATENT DOCUMENTS

| | | | |
|---|---|---|---|
| 5,110,651 A | 5/1992 | Massard et al. | |
| 5,515,022 A * | 5/1996 | Tashiro | H01F 17/0013 336/200 |
| 5,827,445 A | 10/1998 | Yoshida et al. | |
| 6,392,525 B1 * | 5/2002 | Kato | H01F 3/08 336/200 |
| 6,466,122 B1 | 10/2002 | Hasegawa et al. | |
| 2001/0024739 A1 | 9/2001 | Mizoguchi et al. | |
| 2005/0188529 A1 | 9/2005 | Uriu et al. | |
| 2006/0152321 A1 | 7/2006 | Jung et al. | |
| 2006/0220776 A1 | 10/2006 | Fujiwara | |
| 2006/0290457 A1 | 12/2006 | Lee et al. | |
| 2007/0030108 A1 * | 2/2007 | Ishimoto | H01F 10/14 336/200 |
| 2009/0045905 A1 | 2/2009 | Nakagawa et al. | |
| 2010/0007453 A1 * | 1/2010 | Yan | H01F 41/04 29/602.1 |
| 2010/0259351 A1 | 10/2010 | Bogert et al. | |
| 2010/0271161 A1 * | 10/2010 | Yan | H01F 1/26 336/83 |
| 2011/0186771 A1 | 8/2011 | Hussain et al. | |
| 2011/0260825 A1 | 10/2011 | Doljack et al. | |
| 2016/0294274 A1 | 10/2016 | Wennerstrom et al. | |
| 2016/0343486 A1 | 11/2016 | Kim et al. | |

FOREIGN PATENT DOCUMENTS

| | | |
|---|---|---|
| JP | 2006-190948 A | 7/2006 |
| JP | 2016-174142 A | 9/2016 |
| JP | 2016-219781 A | 12/2016 |
| JP | 2017-005115 A | 1/2017 |
| JP | 2017-199734 A | 11/2017 |
| TW | 200703379 A | 1/2007 |

OTHER PUBLICATIONS

Office Action, issued by the Taiwanese Patent Office dated Jun. 21, 2021, in connection with Taiwanese Patent Application No. 106145690.
International Search Report Issued in PCT/US2017/062026 dated Jan. 23, 2018.
Written Opinion Issued in PCT/US2017/062026 dated Jan. 23, 2018.
Office Action, issued by the Japanese Patent Office dated May 10, 2022, in connection with Japanese Patent Application No. 2020-526623.

* cited by examiner

SUBSTRATE-COMPATIBLE INDUCTORS WITH MAGNETIC LAYERS

CROSS-REFERENCE TO RELATED APPLICATIONS

The present application is a 35 U.S.C. 371 National Stage Entry of PCT/US2017/062026, filed on Nov. 16, 2017, the contents of all of which are herein incorporated by reference in their entirety.

FIELD OF THE INVENTION

The present invention relates to planar inductors comprising conductive coils and magnetic layers which are compatible with semiconductor processing techniques.

BACKGROUND

Inductors are passive linear electrical circuit elements that store electrical energy in a magnetic field as current flows through a coiled conductor. The inductance (L) of an inductor is measured in Henrys (H).

Inductors are used in a variety of electrical circuits. For example, inductors are used in power modules such as voltage regulators, inverters, buck converters, and boost converters. Power modules are used in nearly every electrical system to translate incoming power originating from a utility or energy storage device into a power source that is usable by the sub-circuits within an electrical system. For example, displays may require a high voltage, high frequency power source; microprocessors may require a low voltage direct current (DC) power source; and a disk drive may require a higher voltage DC power source compared to the microprocessor. An electrical system having a wider variety of power needs requires a greater number of power modules and therefore a greater number of inductors. Inductors are typically discrete components that require a significant amount of real estate compared to other components in power modules. As processing needs increase and devices become ever smaller and multifunctional, reducing inductor size can result in reducing the amount of real estate needed for power modules, therefore facilitating miniaturization.

For power modules and other electrical circuits incorporating inductors fabricated on a printed circuit board (PCB), inductors are typically discrete devices mounted to the PCB separate from chips (such as power module chips) containing active components. Beyond real estate concerns, mounting an inductor separately on a PCB requires relatively long lengths of wire leads from the inductor to the active components. These leads induce significant parasitic inductance as circuits scale down in size, and for very small circuits, mounting an inductor on a PCB as a discrete component separate from the active component chip becomes impractical due to effects of parasitic inductance.

A variety of approaches have been utilized to address miniaturization and parasitic inductance design requirements. Most of these approaches involve situating the inductor in closer proximity to a semiconductor chip such as a power module chip by mounting the inductor on the chip package, integrating the inductor into the chip package, or integrating the inductor into a substrate that the packaged chip is then mounted on. In these approaches, the inductor and the semiconductor chip are separately fabricated.

Other attempts have been made to fabricate inductors directly on semiconductor chips. However, integrating an inductor on a semiconductor chip faces technological challenges due in large part to the difficulty of miniaturizing inductors to a size that is compatible with chip-level design. Simply integrating existing inductor technology on a semiconductor chip is impractical because geometries of discrete inductors are too large, discrete inductors have a three-dimensional structure, and the magnetic materials used in discrete inductors are not readily incorporated into the semiconductor chip fabrication process. Because of the challenges of integrating an inductor on a semiconductor chip, the most common on-chip regulator designs are based on switch capacitor technology, omitting inductors from the regulator design.

There is therefore a need for an improved inductor design that is compatible with semiconductor processing techniques, is capable of achieving inductance values suitable for power module and other on-chip circuit applications, and has a size and geometry suitable for on-chip fabrication.

SUMMARY

Aspects of the present disclosure relate to a planar inductor. An embodiment of the present disclosure can comprise a substrate, a first magnetic layer disposed on at least a portion of the substrate, a conductive coil disposed on a first portion of the first magnetic layer, and a second magnetic layer disposed on a second portion of the first magnetic layer and on at least a portion of the conductive coil.

Some embodiments can include more than one conductive coil, for example, the inductor can further comprise a second conductive coil disposed on at least a third portion of the first magnetic layer, wherein the second magnetic layer is further disposed on at least a portion of the second conductive coil.

In some embodiments, at least one of the first and second magnetic layers can comprise magnetic flakes. At least one of the first and second magnetic layers can comprise magnetic flakes in a flexible polymer matrix. The thickness of at least a portion of the magnetic flakes can be within the range of about four times to about one hundred times the diameter of magnetic flakes. The magnetic flakes can comprise a magnetic material having a thickness of less than a skin depth for the magnetic material, the skin depth being determined for an operational frequency of about 10 megahertz. At least a portion of the magnetic flakes within the first or second magnetic layers can be substantially aligned with respect to each other within the respective layer.

In some embodiments, the magnetic flakes can comprise at least one of iron, aluminum, or tungsten. At least a portion of the magnetic flakes can comprise at least one of NiFeMo, NiFe, CoZrO, or NiFeAlSi. Each of the magnetic flakes can have a thickness of from about 0.1 to about 5 micrometers. Each of the magnetic flakes can have a diameter from about 8 to about 200 micrometers.

In some embodiments, the inductor can comprise an electrically insulating layer or coating disposed directly on the conductive coil.

In some embodiments, at least one of the first and second magnetic layers comprise magnetic particles.

In some embodiments, the first magnetic layer can comprise magnetic flakes and a first electrically insulating adhesive, and the second magnetic layer can comprise magnetic flakes and a second electrically insulating adhesive. The first electrically insulating adhesive and the second electrically insulating adhesive can provide electrical insulation between adjacent magnetic flakes. A first volume ratio of the magnetic flakes in the first magnetic layer to the first electrically insulating adhesive and a second volume ratio of the magnetic flakes in the second magnetic layer to the second electrically insulating adhesive can each be from about 50:50 to about 90:10. At least a portion of the magnetic flakes within the first or second magnetic layers can be substantially aligned with respect to each other within the respective layer.

In some embodiments, the second magnetic layer can be conformally disposed on at least a portion of the conductive coil. The second magnetic layer can be conformally disposed on a top surface and side surfaces of the conductive coil. The first magnetic layer and the second magnetic layer together can conform to top, bottom, and side surfaces of at least a portion of the conductive coil.

In some embodiments, an electrically insulating adhesive coating can bond the second portion of the first magnetic layer to the second magnetic layer and at least a portion of the conductive coil to the second magnetic layer. The electrically insulating adhesive coating can have a thickness of from about 0.1 micrometers to about 5 micrometers.

In some embodiments, a side surface of the conductive coil and a top surface of the conductive coil can form an obtuse angle. The side surface of the conductive coil can be a concave curved surface.

Some embodiments can further comprise an insulating filler layer. The insulating tiller layer can reside in a plane of the conductive coil between the first and the second magnetic layers. The insulating filler layer can electrically insulate the conductive coil from the first magnetic layer and the second magnetic layer.

Some embodiments can further comprise a magnetic adhesive layer. The magnetic adhesive layer can reside in a plane of the conductive coil between the first and the second magnetic layers. The magnetic adhesive layer can comprise magnetic particles suspended in a polymer. The magnetic particles can have a diameter from about 0.5 micrometers to 3 micrometers. The magnetic particles in the magnetic adhesive layer can be comprised of at least one of NiFe or CoFe. A ratio by volume of the magnetic particles to the polymer in the magnetic adhesive layer can be from about 60:40 to about 80:20. The magnetic adhesive layer can electrically insulate the conductive coil from the first magnetic layer the and second magnetic layer.

In some embodiments, the conductive coil can comprise copper.

In some embodiments, the substrate can comprise at least one of an organic material, a glass material, or a silicon material.

In some embodiments, the coil can have a plurality of windings, forming a spiral structure.

In some embodiments, the coil can have a plurality of windings forming a meandering structure.

In some embodiments, each of the first magnetic layer and the second magnetic layer can have an effective permeability of from about 10 to about 1000 at an operational frequency of about 500 megahertz.

In some embodiments, the first magnetic layer and the second magnetic layer each have a thickness from about 10 to 300 micrometers.

Another embodiment of the present disclosure can include a planar inductor comprising a substrate, a first flexible magnetic layer comprising a polymer and a plurality of magnetic flakes suspended in the polymer, a conductive coil disposed on a first portion of the first magnetic layer, an electrically isolating layer disposed on the conducting coil, and a second magnetic layer comprising a polymer and a plurality of magnetic particles suspended in the polymer, wherein the second magnetic layer is disposed on a second portion of the first magnetic layer and on at least a portion of the conductive coil.

BRIEF DESCRIPTION OF THE DRAWINGS

Reference will now be made to the accompanying drawings, which are not necessarily drawn to scale.

DETAILED DESCRIPTION

Figure 1A:
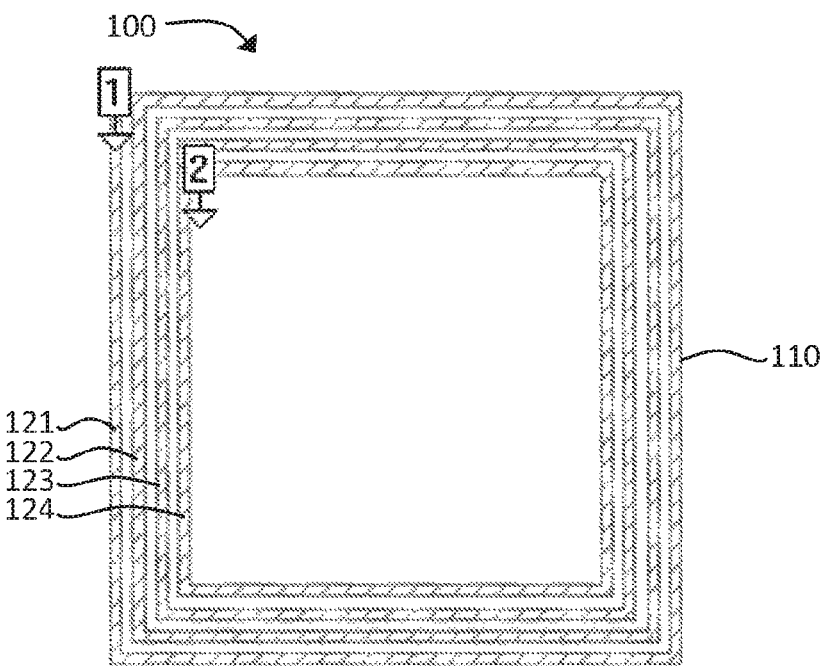
FIGS. 1A, 1B, and 1C are top down drawings of example geometries of planar inductors according to example embodiments.

It must also be noted that, as used in the specification and the appended claims, the singular forms "a," "an" and "the" include plural references unless the context clearly dictates otherwise. For example, reference to a component is intended also to include composition of a plurality of components. References to a composition containing "a" constituent is intended to include other constituents in addition to the one named.

Also, in describing the certain example embodiments, terminology will be resorted to for the sake of clarity. It is intended that each term contemplates its broadest meaning as understood by those skilled in the art and includes all technical equivalents which operate in a similar manner to accomplish a similar purpose.

Ranges can be expressed herein as from "about" or "approximately" or "substantially" one particular value and/or to "about" or "approximately" or "substantially" another particular value. When such a range is expressed, other example embodiments include from the one particular value and/or to the other particular value.

Similarly, as used herein, "substantially free" of something, or "substantially pure", and like characterizations, can include both being "at least substantially free" of something, or "at least substantially pure", and being "completely free" of something, or "completely pure".

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a composition does not preclude the presence of additional components than those expressly identified.

The materials described as making up the various elements of certain embodiments are intended to be illustrative and not restrictive. Many suitable materials that would perform the same or a similar function as the materials described herein are intended to be embraced within the scope of the invention. Such other materials not described herein can include, but are not limited to, for example, materials that are developed after the time of the development of the invention.

High-density (i.e. higher inductance at a smaller size), high frequency inductors compatible with large area substrates enable miniaturization of circuits including inductors such as power modules. Inductors that are compatible with semiconductor chip manufacturing processes offer the possibility for integration of power modules into multi-functional semiconductor chip designs as well as facilitate the miniaturization of electronic systems and products. Embodiments of the disclosed technology can be compatible with large-area substrate-compatible processes for high volume manufacturing at low cost. Some embodiments of the disclosed technology can provide inductor structures compatible with size, geometry, and manufacturing processes restrictions of semiconductor chip designs, which can enable the integration of inductors into circuits on semiconductor chips containing active components (e.g. transistors).

Embodiments of the disclosed technology can utilize magnetic materials in planar inductor structures resulting in high-density inductors. Embodiments of the disclosed technology can comprise magnetic layers containing metal flakes. In some embodiments, the metal flakes can be bonded with a polymer resin to form magnetic sheets. The use of metal flakes in place of a continuous magnetic material can have the advantage of reducing eddy cuffent effects. In some embodiments, the inductor can comprise magnetic sheets that can be bonded to substrates using lamination processes, and the inductor structure can be fabricated using standard fabrication techniques such as lithography and electroplating.

Embodiments of the disclosed technology can also comprise magnetic particles. In some embodiments, the metal particles can be coated in a polymer adhesive to form a magnetic paste. In some embodiments, the magnetic paste can be used as a magnetic core material. In some embodiments, the magnetic paste can be used as an adhesive for bonding a magnetic sheet to an inductor coil, or bonding a lower magnetic sheet to an upper magnetic sheet thereby providing a magnetic filler between inductor coil windings. In some embodiments, the magnetic paste may be used as a magnetic core material, an adhesive, or both.

In accordance with various embodiments, the magnetic inductor core material can have certain properties including, but not limited to, low loss, low coercivity, high permeability, high frequency stability, scalability to adequate thickness at low cost for power handling, and the like. As will be appreciated and understood, example embodiments disclosed herein can be tailored to meet specific needs of a system or inductor design. Physical dimensions and material choices discussed in example embodiments and implementations are non-limiting, and variations in said dimensions and material choices not disclosed herein can be utilized without exceeding the limits of the present disclosure.

Referring now to the Figures, in which like reference numerals represent like parts, various embodiments of the inductor will be discussed in detail.

Figure 1B:
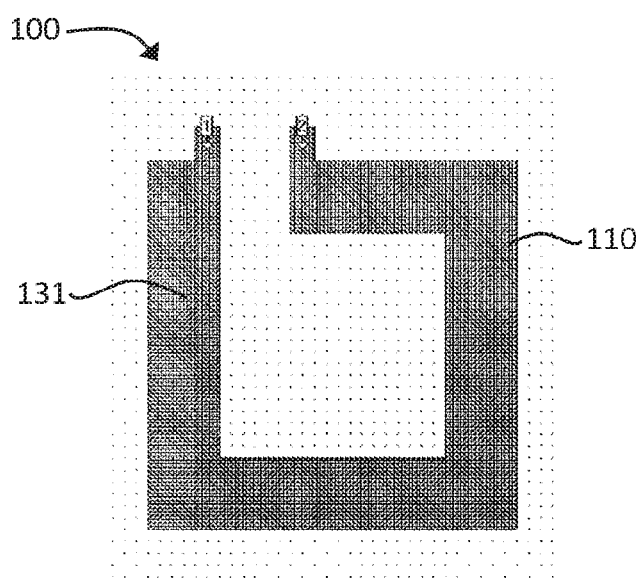
Figure 1C:
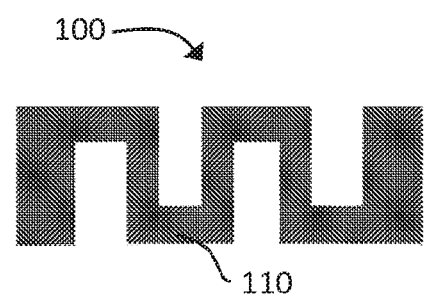

FIGS. 1A, 1B, and 1C show top-down views of inductor coil structures of a planar inductor 100 in accordance with an exemplary embodiment. FIG. 1A depicts a conductive coil 110 structure with four windings (first, outer winding 121, second winding 122, third winding 123, and fourth, inner winding 124) forming a spiral. FIG. 1B depicts a conductive coil 110 structure with a single winding 131. FIG. 1C depicts a meandering conductive coil 110 structure. In some embodiments, the inductor can be a planar inductor 100 having a conductive coil 110 that has one or more windings, occupies a plane, and can be square, rectangular, circular, or some other shape. As will be appreciated and understood, planar inductors may have a variety of geometries, and therefore FIGS. 1A, 1B, and 1C are provided as non-limiting examples. The conductive coil 110 can comprise a conductive metal such as copper.

FIGS. 2A, 2B, 2C, 2D, and 2E show drawings of cross-sections of a planar inductor according to some example, embodiments. Depicted embodiments include a substrate 210, a first magnetic layer 220, and a conductive coil 110. Some embodiments can include additional structures such as a second magnetic layer 230, an insulating filler layer 250, and/or a magnetic adhesive 260. According to some embodiments, a thin adhesive coating 240, which can be from about 0.1 to about 5 micrometers thick, can bond a layer 220, 230, 250, 260 to another layer, the conductive coil 110, or the substrate 210. The thin adhesive coating 240 may additionally or alternatively serve as electrical insulation between layers and the conductive coil. The adhesive coating can be a planar film or conformal coating.

Structures or components of the inductor can be directly disposed on other structures or components, or an intervening structure or component can exist between a structure or component disposed on another structure or component. For example, as depicted in FIGS. 2A 2B, 2C, 2D, and 2E, the first magnetic layer 220 is disposed on the substrate 210. The first magnetic layer 220 can be disposed directly on the substrate 210, or an intervening laver, such as an insulating layer, an adhesive laver, or an adhesive coating can exist between the first magnetic layer 220 and the substrate 210.

The substrate 210 can be a passive substrate comprising silicon, glass, or an organic material for example, or the substrate can be a semiconductor chip with active components. The substrate 210 can provide mechanical stability for the inductor. The substrate 210 can allow the inductor to interconnect with electrical circuit components.

In some embodiments, inductor magnetic cores can include magnetic layers 220, 230 and magnetic adhesives 260. In some embodiments, magnetic cores can serve to increase the inductance density of the inductor compared to an inductor that does not incorporate magnetic materials. Either magnetic layer 220, 230 or the magnetic adhesive 260 can comprise electrically isolated magnetic particles or electrically isolated magnetic flakes having a flat, thin shape. According to some embodiments, either magnetic layer 220, 230 or the magnetic adhesive 260 can comprise an electrically insulating adhesive such as, but not limited to, a polymer resin that can electrically isolate and bond the magnetic particles or magnetic flakes, providing electrical insulation between adjacent magnetic flakes or particles. The electrically insulating adhesive can serve as a bonding agent between structures of the inductor. According to some embodiments, magnetic layers or adhesives can comprise a ratio of magnetic flakes to electrically insulating adhesive from about 50:50 to about 90:10 by volume. According to some embodiments, magnetic layers or adhesives can comprise a ratio of magnetic particles to electrically insulating adhesive from about 60:40 to about 80:20 by volume.

In some embodiments, magnetic flakes can reduce eddy current effects compared to a. magnetic layer consisting of a contiguous magnetic material. Eddy current effects can be reduced when magnetic flakes are substantially aligned along magnetic field lines (parallel to the magnetic field) and thickness of the magnetic flakes is approximately equal to or less than the magnetic skin depth of the material of the flake over the desired operational frequency range. Skin depth can be computed using the following equation:

$$\delta = \sqrt{\frac{\rho}{\pi f \mu}} \qquad \text{(Equation 1)}$$

where δ is the skin depth f is the frequency of operation, ρ is the resistivity of the magnetic material, and μ is the intrinsic permeability of the magnetic material. Skin depth (δ) decreases with increasing operational frequency (f). Therefore, thinner magnetic flakes reduce eddy current loss and enable frequency-stability of permeability at higher frequency ranges.

According to example embodiments, magnetic flakes can comprise one of more of iron, an iron alloy, aluminum, tungsten, an oxide, and the like. For example, NiFe, NiFeMo, and CoZrO are magnetic materials having high saturation magnetism (0.8 to 1 Tesla) and low coercivity (less than 1 Oested). NiFe, NiFeMo, and CoZrO have a calculated skin depth of approximately 2.2 μm, 4.8 μm, and 27.6 μm respectively at an operational frequency of 10 megahertz (MHz). As will be appreciated and understood, magnetic flakes may be composed of many additional or alternative magnetic materials and alloys, including by not limited to NiFeAlSi.

Magnetic flakes can also have an outer non-conductive oxide layer that does not contribute to eddy currents or permeability of the magnetic layer. Therefore, the effective thickness of a magnetic flake can be less than the actual flake thickness. For some applications, it can be beneficial to utilize magnetic flakes having an outer non-conductive oxide layer as the oxide layer can provide electrical insulation between magnetic flakes.

The geometry of the magnetic flakes and magnetic particles can determine their permeability, eddy current and hysteresis losses, frequency stability and current-handling. These properties can come at the expense of each other. However, while not wishing to be bound by theory, it is thought that magnetic flakes can give an additional degree of freedom in designing the particle with the right combination of properties for the target applications. By increasing the in-plane dimensions, permeability can be increased at the expense of current-handling. By reducing the in-plane dimensions, frequency stability can be enhanced at the expense of the permeability. Magnetic flake composites have been shown to achieve frequency stability beyond 1000 MHz.

Figure 4:
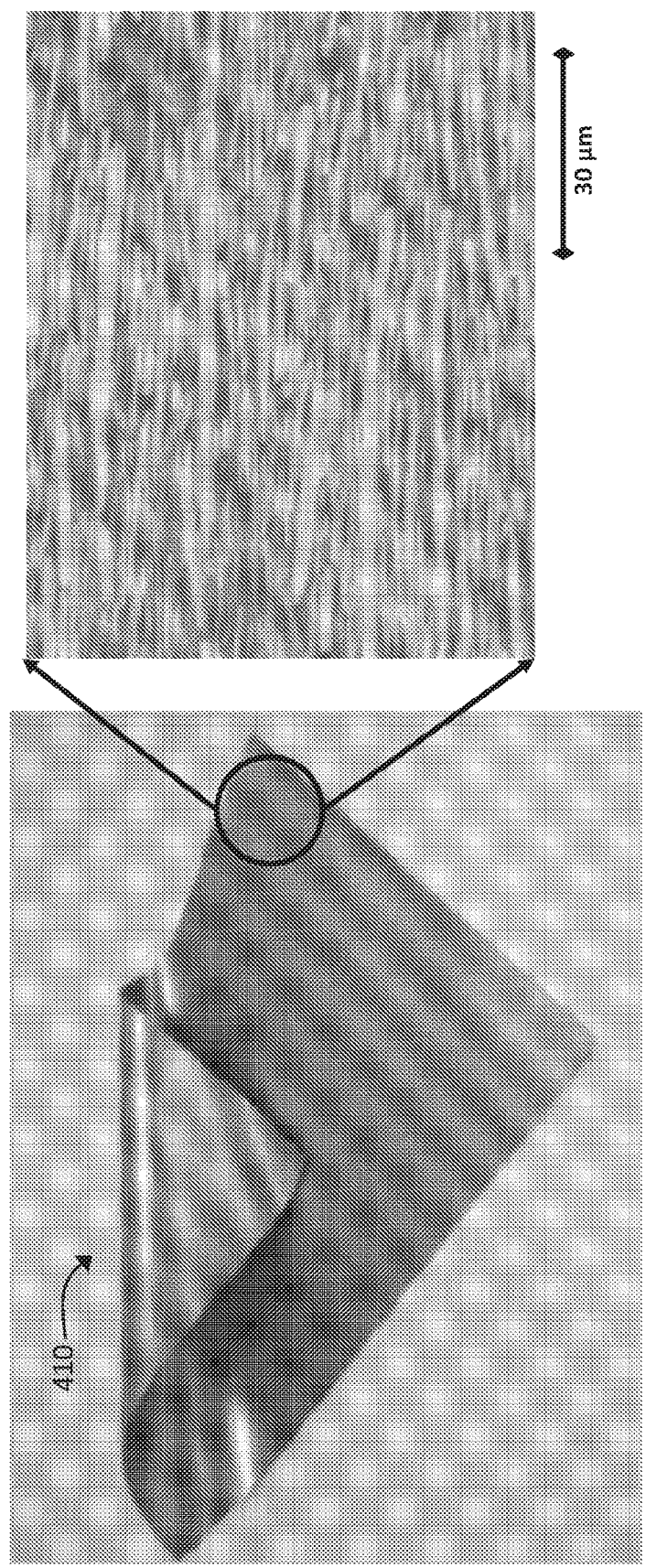
FIG. 4 shows images of a magnetic layer according to example embodiments.

Magnetic flakes can be made from top-down approaches such as milling and grinding. Such flake fabrication techniques can create size variations with a magnetic layer. The morphology of magnetic flakes can be characterized with a scanning electron microscope, for example as shown in FIG. 4. Although in-plane dimensions (or diameters) and thicknesses of magnetic flakes can be non-uniform for a given flake and vary from flake to flake, flakes having dimensions falling within the ranges described below can be effective at achieving a desired combination of properties for target applications.

In some embodiments, the thickness of magnetic flakes in a magnetic layer 220, 230 can be approximately equal to or less than the skin depth of the material of the flake as calculated at the maximum desired operational frequency. Magnetic flakes having an outer non-conductive oxide layer can be thicker than the depth of the outer oxide layer. For many magnetic materials, magnetic flakes with a thickness between 0.1 to 1 micrometer (μm) can be effective at suppressing eddy currents at operational frequencies up to at least 10 MHz. For magnetic materials with deeper skin depths, or where lower operational frequencies are desired, magnetic flakes having a thickness up to about 5 μm can be effective at suppressing eddy currents. Magnetic flakes with large diameters (greater than 8 μm) can provide the advantage of large in-plane permeability, with an upper bound on flake diameter around 200 μm due to practicality in fabrication of magnetic layers for inductors. The magnetic flakes can have a diameter that is from about four times to a hundred times the thickness of the magnetic flake. In some embodiments, smaller diameter magnetic flakes (from about 3 to about 5 μm) or smaller diameter magnetic particles (from about 0.5 to about 3 μm) may be beneficial in adhesive layers between magnetic layers 220, 230.

Figure 3:
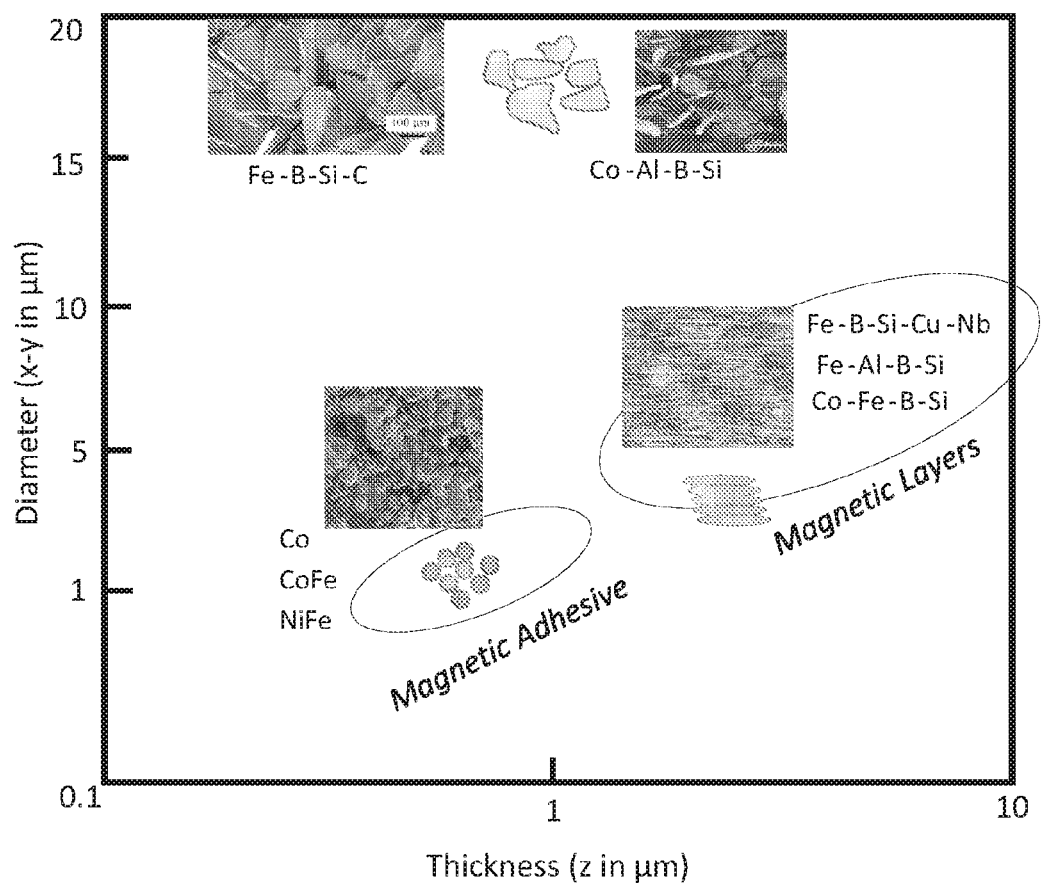
FIG. 3 is a graphical representation of potential material options for magnetic layers and adhesives according to example embodiments.

FIG. 3 illustrates some material options for magnetic layers and magnetic adhesives according to example embodiments. Magnetic materials identified in FIG. 3 and listed here are not intended to be limiting. As will be appreciated and understood, magnetic materials having desired material properties may be substituted for materials utilized in example implementations described herein. As will be appreciated and understood, dimensions of magnetic particles and magnetic flakes may be tailored based on the material properties of the material and the design and operational requirements of the inductor.

Magnetic flakes or particles can be mixed with an adhesive such as epoxy and pressed into a magnetic sheet 410 as depicted in FIG. 4. Flexible magnetic sheets 410 allow for large area panel integration with low cost. FIG. 4 includes a cross section view of a magnetic sheet 410 according to an implementation of an example embodiment. As shown in FIG. 4, the sheet 410 can include magnetic flakes substantially aligned with each other. The shape anisotropy of the aligned flakes can have the advantage of aligning magnetic spins in the plane of the magnetic flakes and the magnetic sheet 410 resulting in high magnetic permeability of the magnetic sheet 410. Layering the aligned flakes, as shown in the example implementation depicted in FIG. 4 can lead to higher packing density of magnetic material compared to a composite having magnetic particles or unaligned flakes, resulting in high saturation magnetization and permeability.

In some embodiments, the adhesive within magnetic sheet 410 can electrically isolate magnetic flakes or particles from each other, bond magnetic flakes or particles, electrically isolate a magnetic sheet 410 from other structures, and/or bond a magnetic sheet 410 to other structures. A potential advantage of a magnetic sheet 410 is that it can be laminated to a substrate or other inductor structures and can be further processed according to standard. semiconductor fabrication techniques, making it compatible for use on brittle substrates, including, but not limited to, silicon, glass, and semiconductor chips with active components.

Magnetic sheets used as magnetic layers in example embodiments can have an effective permeability for each layer from about 200 to about 1000 at an operational frequency of 10 Mhz. Magnetic sheets may have a thickness from about 10 to 300 μm. Magnetic sheets may have a ratio by volume of magnetic flakes or magnetic particles to adhesive from about 50:50 to about 90:10.

According to some example embodiments, magnetic flakes or particles can be mixed with an adhesive such as an epoxy polymer to form a paste-like magnetic adhesive. For example, the magnetic adhesive can be used to create a magnetic layer, to fill cavities or gaps between structures of the inductor, and/or to bond structures of the inductor. Magnetic layers consisting of magnetic paste having spherical NiFe alloy particles with diameters from about 0.2 to 1 µm where fabricated and measured to have a permeability of 55 at operational frequencies up to 10 MHz.

According to example embodiments, an inductor can include some or all of the following structures: a substrate 210, a first magnetic layer 220, a conductive coil 110, a second magnetic layer 230, an insulating filler layer 250, a magnetic adhesive 260, and at least one thin adhesive coating 240. FIGS. 2A 2B, 2C, 2D, and 2E show aspects of example embodiments.

Figure 2A:
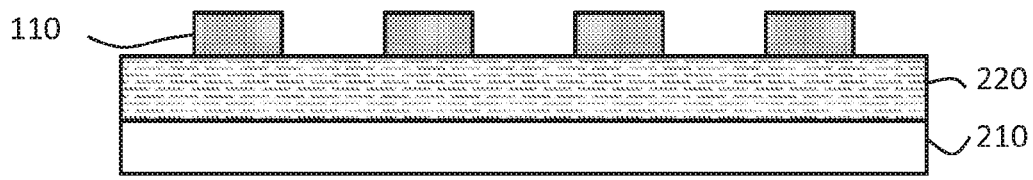
FIGS. 2A, 2B, 2C, 2D, and 2E are drawings depicting a cross-sectional view of planar inductors according to example embodiments.

FIG. 2A depicts the cross section of a planar inductor according to a first example embodiment. The inductor includes a substrate 210, a first magnetic layer 220 disposed on the substrate 210, and a conductive coil 110 disposed on a portion of the first magnetic layer 220. The first magnetic layer 220 can be disposed directly on the substrate 210, or can be disposed on the substrate 210 via an intervening layer, such as a thin adhesive coating 240 bonding the first magnetic layer 220 to the substrate 210. Likewise, the conductive coil 110 can be disposed directly on the first magnetic layer 220 (as shown) or disposed on the first magnetic layer 220 via an intervening layer or adhesive residing between the conductive coil 110 and the first magnetic layer 220. The first magnetic layer 220 can comprise magnetic flakes (as shown) or magnetic particles, and can additionally comprise an adhesive material. The first magnetic layer 220 can be a magnetic sheet 410 or a paste-like magnetic adhesive.

Figure 2B:
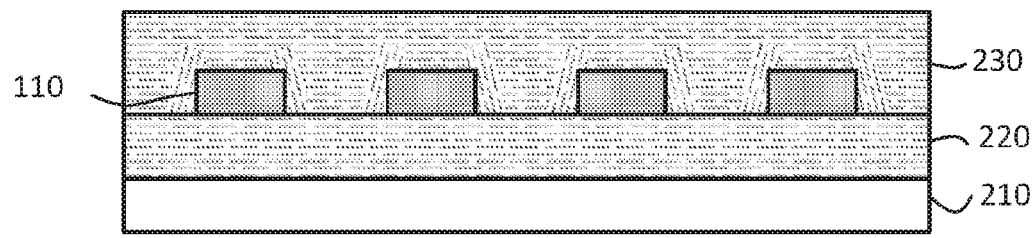

FIG. 2B depicts the cross section of a planar inductor according to a second example embodiment. The inductor includes a substrate 210, a first magnetic layer 220 disposed on the substrate 210, a conductive coil 110 disposed on a first portion of the first magnetic layer 220, and a second magnetic layer disposed on the conductive coil 110 and a second portion of the first magnetic layer 220. The first magnetic layer 220 can be disposed directly on the substrate 210, or can be disposed on the substrate 210 via an intervening layer, such as a thin adhesive coating 240 bonding the first magnetic layer 220 to the substrate 210. The conductive coil 110 can be disposed directly on the first magnetic layer 220 (as shown) or can be disposed on the first magnetic layer 220 via an intervening layer or adhesive residing between the conductive coil 110 and the first magnetic layer 220. The second magnetic layer 230 can be disposed directly on the first magnetic layer 220 and the conductive coil 110 (as shown) or can be disposed on the first magnetic layer 220 and the conductive coil 110 via an intervening layer or adhesive residing between the second magnetic layer 230 and the first magnetic layer 220 or the conductive coil 110. Either magnetic layer 220, 230 can comprise magnetic flakes (as shown) or magnetic particles, and can comprise an adhesive material. Either magnetic layer 220, 430 can be a magnetic sheet 410 or a paste-like magnetic adhesive.

As shown in FIG. 2B, the first and second magnetic layers 220, 230 conform to top, bottom, and side surfaces of at least a portion of the conductive coil 110. The conformal structure can increase the density of the inductor, resulting in the inductor having a higher inductance for a given inductor coil geometry and size compared to an inductor with an intervening material or structure between magnetic layers 220, 230. Either magnetic layer 220, 230 can include magnetic flakes that are substantially aligned with each other. In some embodiments, magnetic flakes that additionally align with the surfaces of the conductive coil 110 can align with magnetic field lines near the conductive coil 110 and further increase the density of the inductor.

In some embodiments, the second magnetic layer 230 can be a magnetic sheet 410 comprising substantially aligned magnetic flakes that is applied to the inductor structures by using an isostatic press and a low-viscosity monomer adhesive to wrap the magnetic sheet around the conductive coil 110 such that the magnetic flakes near the conductive coil align with the surface of the conductive coil 110. In some embodiments, the low-viscosity adhesive can be a planar film or conformal coating. With planar films, standard lamination processes can be used; however, flux leakage can occur, compromising inductance. Conformal adhesives can be thinned down to minimize flux leakage, resulting in higher inductance compared to use of planar films.

Figure 2C:
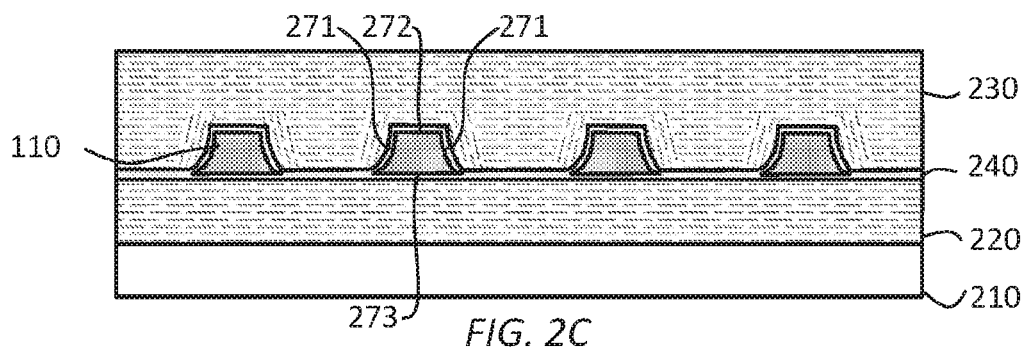

FIG. 2C depicts the cross section of a planar inductor according to a third example embodiment. FIG. 2C includes a substrate 210, a first magnetic layer 220 disposed on the substrate 210, a conductive coil 110 disposed on a first portion of the first magnetic layer 220, and a second magnetic layer disposed on the conductive coil 110 and a second portion of the first magnetic layer 220 as described in relation to FIG. 2B. Structures in FIG. 2C can likewise be constructed and disposed as described in relation to FIG. 2B.

FIG. 2C additionally shows a thin adhesive coating 240 bonding the conductive coil 110 to the first and second magnetic layers 220, 230 and bonding the second magnetic layer 230 to the first magnetic layer. As will be appreciated and understood, structures can be directly disposed, and all or portions of the adhesive coating 240 may be eliminated. For example, the first and second magnetic layers 220, 230 can include an adhesive for self-bonding to conductive coil 110 and bonding between layers 220, 230.

FIG. 2C further illustrates a conductive coil 110 in which the side surfaces and top surface form an obtuse angle. In some embodiments, the side surfaces can have a concave shape. The sloped side surfaces can improve the conformity of the second magnetic layer 230 to the top 272 and side surfaces 271 of the conductive coil 110. The sloped side surfaces can additionally promote alignment of magnetic flakes in the second magnetic layer 230 to the top and side surfaces of the conductive coil 110. As shown, and according to some embodiments, magnetic flakes in the first magnetic layer 220 may align with a bottom surface 273 of the conductive coil 110.

Figure 5:
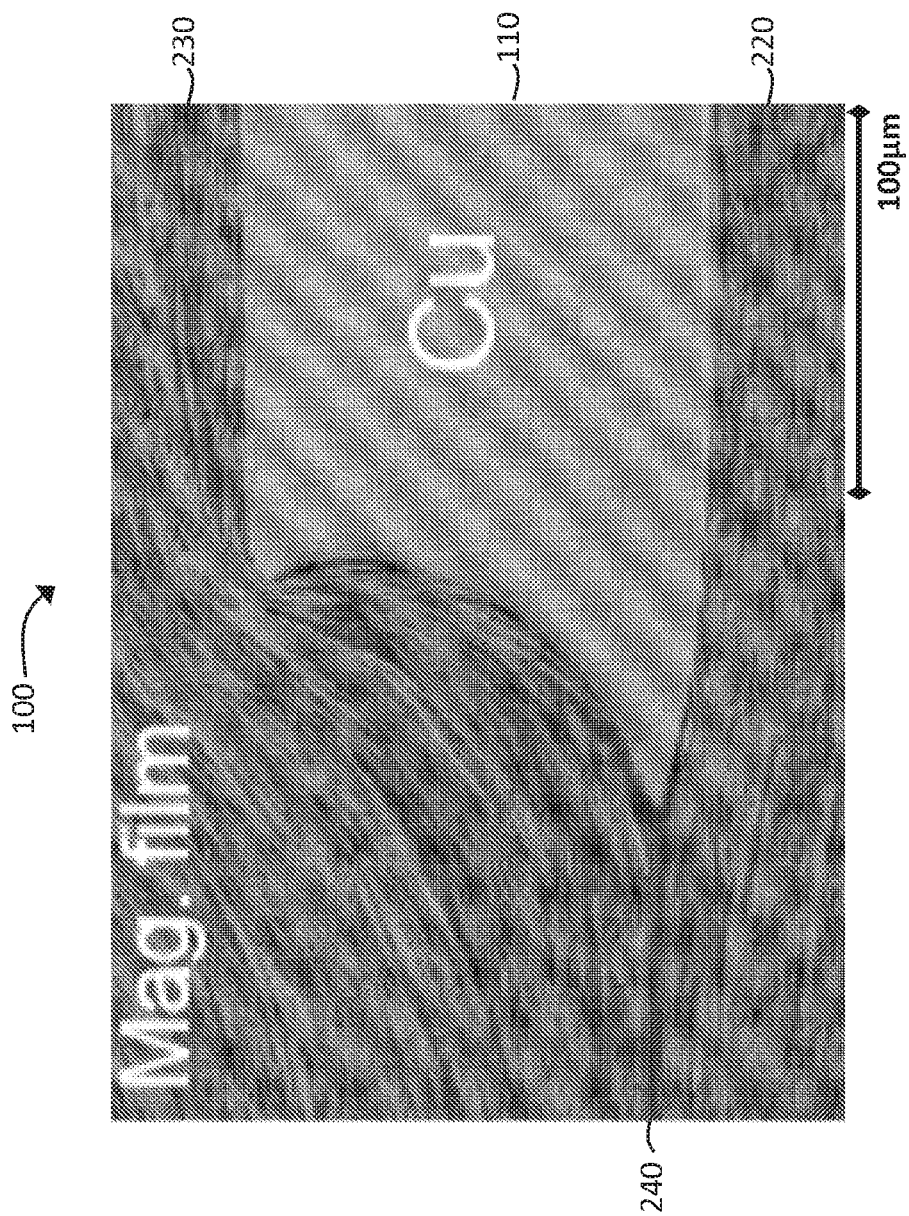
FIG. 5 shows a magnified cross-sectional image of a fabricated inductor according to an example embodiment.

FIG. 5 is a cross sectional image of an inductor 100 according to an implementation of the example embodiment depicted in FIG. 2C. FIG. 5 shows a first magnetic layer 220 comprising substantially aligned magnetic flakes, a conductive coil 110, a second magnetic layer 230 comprising substantially aligned magnetic flakes, and an adhesive coating 240 bonding the conductive coil 110 to the first and second magnetic layers 220, 230 and bonding the first magnetic layer 220 to the second magnetic layer 230. As shown, the conductive coil 110 has a side surface with a concave shape that is sloped at an obtuse angle to the top surface. Magnetic flakes in the first and second magnetic layers 220, 230 near the conductive coil 110 can be substantially aligned with the surfaces of the conductive coil 110.

Figure 2D:
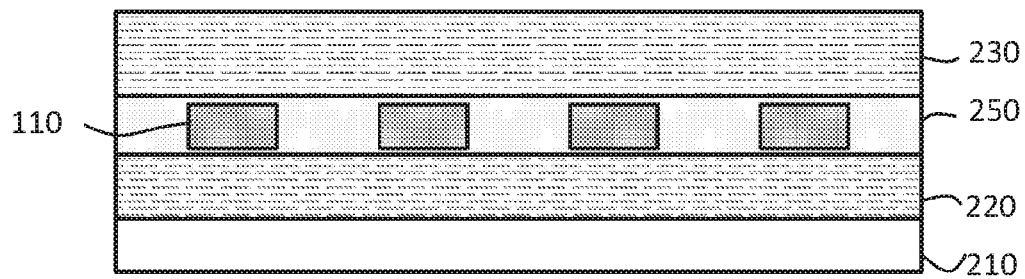

FIG. 2D depicts the cross section of a planar inductor according to a fourth example embodiment. The inductor includes a substrate 210, a first magnetic layer 220 disposed on the substrate 210, and a conductive coil 110 disposed on a first portion of the first magnetic layer 220, a second magnetic layer 230 disposed on the conductive coil 110 and a second portion of the first magnetic layer 220, and an insulating filler layer 250 disposed between the first magnetic layer 220 and second magnetic layer 230. The insulating filler layer 250 can reside in the plane of the conductive coil 110. The insulating filler layer 250 can provide electrical insulation between windings of the conductive coil 110, can provide electrical insulation between the first and second magnetic layers 220, 230, can provide electrical insulating between the conductive coil 110 and either magnetic layer 220, 230, can include an adhesive, can bond the conductive coil 100 to the first magnetic layer 220, can bond the conductive coil to the second magnetic layer 230, and/or can bond the first magnetic layer 220 to the second magnetic layer 230. The insulating filler layer 250 can have a bottom planar surface disposed, either directly or indirectly, on the first magnetic layer 220. The insulating filler layer 250 can have a top planar surface on which the second magnetic layer 230 is disposed, either directly or indirectly.

The first magnetic layer 220 can be disposed directly on the substrate, or can be disposed indirectly via an intervening layer, such as a thin adhesive coating 240 bonding the first magnetic layer 220 to the substrate 210. A portion of the insulating filler layer 250 can form an intervening layer between the conductive coil 110 and the first magnetic layer 220 (as shown), a different intervening layer or adhesive can reside between the conductive coil 110 and the first magnetic layer 220, or the conductive coil 110 can be disposed directly on the first magnetic layer 220.

The insulating filler layer 250 can be disposed directly on a portion of the first magnetic layer 220 (as shown) or can be disposed on a portion of the first magnetic layer 220 indirectly via an intervening layer or adhesive residing between the insulating filler layer 250 and the magnetic layer 220. The insulating filler layer 250 c completely fill gaps between windings of the conductive coil 110 (as shown), or partially fill gaps between windings of the conductive coil.

The second magnetic layer 230 can be disposed directly on the insulating filler layer 250 (as shown), or can be disposed on the insulating filler layer 250 indirectly via an intervening layer or adhesive residing between the second magnetic layer 230 and the insulating filler layer 250. The insulating filler layer 250 can form an intervening layer between the conductive coil 110 and the second magnetic layer 230 (as shown), a portion of the second magnetic layer can be directly disposed on the conductive coil 110, or a different intervening layer or adhesive can reside between the conductive coil 110 and the second magnetic layer 230.

Either magnetic layer 220, 230 can comprise magnetic flakes (as shown) or magnetic particles, and can additionally comprise an adhesive material. Either magnetic layer 220, 430 can be a magnetic sheet 410 or a paste-like magnetic adhesive.

Figure 2E:
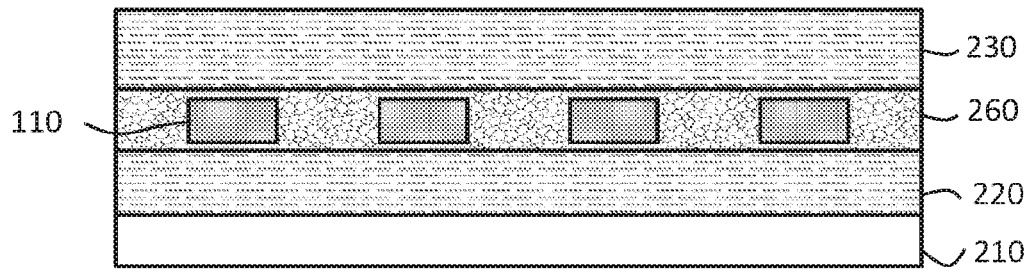

FIG. 2E depicts the cross section of a planar inductor according to a fifth example embodiment. The inductor includes a substrate 210, a first magnetic layer 220 disposed on the substrate 210, and a conductive coil 110 disposed on a first portion of the first magnetic layer 220, a second magnetic layer 230 disposed on the conductive coil 110 and a second portion of the first magnetic layer 220, and a magnetic adhesive 260 disposed between the first magnetic layer 220 and second magnetic layer 230. The magnetic adhesive 260 can include magnetic flakes or particles and a polymer adhesive such as a polymer epoxy. The magnetic particles may comprise a NiFe alloy such as $Ni_{81}Fe_{17}Cu_{1.5}Mo_{0.5}$, for example, a CoFe alloy, or other iron alloy. The magnetic adhesive cart be a paste-like adhesive. Magnetic flakes or particles within the magnetic adhesive can be electrically isolated from each other. Inductors utilizing a magnetic adhesive 260 can have higher density (higher inductance) compared to inductors utilizing an insulating filler layer 250. In some embodiments, the magnetic adhesive can include particles with diameters from about 2 to 20 μm. The magnetic adhesive can include magnetic flakes with diameters from about 3 to 5 μm. The magnetic adhesive can include a ratio of magnetic particles or flakes by volume to polymer from about 60:40 to about 80:20.

The magnetic adhesive layer 260 can reside in the plane of the conductive coil. The magnetic adhesive 260 can provide electrical insulation between windings of the conductive coil 110, can provide electrical insulation between the first and second magnetic layers 220, 230, can provide electrical insulating between the conductive coil 110 and either magnetic layer 220, 230, can bond the conductive coil 100 to the first magnetic layer 220, can bond the conductive coil to the second magnetic layer 230, and/or can bond the first magnetic layer 220 to the second magnetic layer 230. The magnetic adhesive 260 can have a bottom planar surface disposed on the first magnetic layer 220. The magnetic adhesive 260 can have a top planar surface on which the second magnetic layer 230 is disposed, either directly or indirectly.

The first magnetic layer 220 can be disposed directly on the substrate 210, or can be disposed indirectly on the substrate 210 via an intervening layer, such as a thin adhesive coating 240 separating the first magnetic layer 220 and the substrate 210. A portion of the magnetic adhesive 260 can form an intervening layer between the conductive coil 110 and the first magnetic layer 220 (as shown), a different intervening layer or adhesive can reside between the conductive coil 110 and the first magnetic layer 220, or the conductive coil 110 can be disposed directly on the first magnetic layer 220.

The magnetic adhesive 260 can be disposed directly on a portion of the first magnetic layer 220 (as shown), or can be disposed indirectly on a portion of the first magnetic layer 220 via an intervening layer or adhesive residing between the magnetic adhesive 260 and the magnetic layer 220. The magnetic adhesive 260 can completely fill gaps between windings of the conductive coil 110 (as shown), or partially fill gaps between windings of the conductive coil The second magnetic layer 230 can be disposed directly on the magnetic adhesive 260 (as shown), or can be disposed indirectly on the magnetic adhesive 260 via an intervening layer or adhesive residing between the second magnetic layer 230 and the magnetic adhesive 260. The magnetic adhesive 260 can form an intervening layer between the conductive coil 110 and the second magnetic layer 230 (as shown), a portion of the second magnetic layer can be directly disposed on the conductive coil 110, or a different intervening layer or adhesive can reside between the conductive coil 110 and the second magnetic layer 230.

Either magnetic layer 220, 230 can comprise magnetic flakes (as shown) or magnetic particles, and can additionally comprise an adhesive material. Either magnetic layer 220, 430 can be a magnetic sheet 410 or a paste-like magnetic adhesive.

According to a sixth example embodiment, an inductor may comprise a substrate, a first magnetic layer disposed on at least a portion of the substrate, a first magnetic layer disposed on at least a portion of the substrate, a conductive coil disposed on a first portion of the first magnetic layer, a second magnetic layer disposed on a second portion of the first magnetic layer, a second conductive coil disposed on at least a third portion of the first magnetic layer, and the second magnetic layer being disposed on at least a portion of the second conductive coil. The inductors of the present disclosure, however, are not limited to one or two conductive coils. Rather, as those skilled in the art would appreciate, the inductors can contain any number of conductive coils including more than two conductive coils.

What is claimed is:

1. A planar inductor comprising:
   a substrate;
   a first magnetic layer disposed on at least a portion of the substrate;
   a conductive coil disposed on a first portion of the first magnetic layer; and
   a second magnetic layer disposed on a second portion of the first magnetic layer and on at least a portion of the conductive coil,
   wherein at least one of the first and second magnetic layers comprise magnetic flakes in a flexible polymer matrix,
   wherein each of the magnetic flakes has a thickness of from about 0.1 to about 5 micrometers and a diameter from about 8 to about 200 micrometers,
   wherein a plurality of the magnetic flakes of at least the first magnetic layer are substantially aligned with respect to each other and a plurality of magnetic flakes of the second magnetic layer are substantially aligned with respect to each other,
   wherein the first magnetic layer and the second magnetic layer together conform to top, bottom, and side surfaces of at least a portion of the conductive coil,
   wherein a side surface of the conductive coil and a top surface of the conductive coil form an obtuse angle, and
   wherein the side surface of the conductive coil is a concave curved surface.

2. The inductor of claim 1, further comprising a second conductive coil disposed on at least a third portion of the first magnetic layer, wherein the second magnetic layer is further disposed on at least a portion of the second conductive coil.

3. The inductor of claim 1, further comprising an electrically insulating layer or coating disposed directly on the conductive coil.

4. The inductor of claim 1, wherein at least one of the first and second magnetic layers comprise magnetic particles.

5. The inductor of claim 1, where in a thickness of at least a portion of the magnetic flakes is from about four times to about one hundred times a diameter of the magnetic flakes.

6. The inductor of claim 1, wherein the magnetic flakes comprise a magnetic material having a thickness of less than a skin depth for the magnetic material, the skin depth being determined for an operational frequency of about 10 megahertz.

7. The inductor of claim 1, wherein the first magnetic layer comprises magnetic flakes and a first electrically insulating adhesive, and the second magnetic layer comprises magnetic flakes and a second electrically insulating adhesive.

8. The inductor of claim 7, wherein the first electrically insulating adhesive and the second electrically insulating adhesive provide electrical insulation between adjacent magnetic flakes.

9. The inductor of claim 7, wherein a first volume ratio of the magnetic flakes in the first magnetic layer to the first electrically insulating adhesive and a second volume ratio of the magnetic flakes in the second magnetic layer to the second electrically insulating adhesive are each from about 50:50 to about 90:10.

10. The inductor of claim 1, wherein the second magnetic layer is conformally disposed on at least a portion of the conductive coil.

11. The inductor of claim 1, wherein the second magnetic layer is conformally disposed on a top surface and side surfaces of the conductive coil.

12. The inductor of claim 1, further comprising an electrically insulating adhesive coating bonding the second portion of the first magnetic layer to the second magnetic layer and at least a portion of the conductive coil to the second magnetic layer.

13. The inductor of claim 12, wherein the electrically insulating adhesive coating has a thickness of from about 0.1 micrometers to about 5 micrometers.

14. The inductor of claim 1, further comprising an insulating filler layer, the insulating filler layer residing in a plane of the conductive coil between the first and the second magnetic layers.

15. The inductor of claim 14, wherein the insulating filler layer electrically insulates the conductive coil from the first magnetic layer and the second magnetic layer.

16. The inductor of claim 1, further comprising a magnetic adhesive layer, the magnetic adhesive layer residing in a plane of the conductive coil between the first and the second magnetic layers.

17. The inductor of claim 16, wherein the magnetic adhesive layer comprises magnetic particles suspended in a polymer.

18. The inductor of claim 17, wherein the magnetic particles have a diameter from about 0.5 micrometers to 3 micrometers.

19. The inductor of claim 17, wherein at least a portion of the magnetic particles in the magnetic adhesive layer are comprised of at least one of NiFe or CoFe.

20. The inductor of claim 17, wherein a ratio by volume of the magnetic particles to the polymer in the magnetic adhesive layer is from about 60:40 to about 80:20.

21. The inductor of claim 17, wherein the magnetic adhesive layer electrically insulates the conductive coil from the first magnetic layer and the second magnetic layer.

22. The inductor of claim 1, wherein the conductive coil comprises copper.

23. The inductor of claim 1, wherein at least a portion of the magnetic flakes comprise at least one of iron, aluminum, or tungsten.

24. The inductor of claim 1, wherein at least a portion of the magnetic flakes comprise at least one of NiFeMo, NiFe, CoZrO, or NiFeAlSi.

25. The inductor of claim 1, wherein the substrate comprises at least one of an organic material, a glass material, or a silicon material.

26. The inductor of claim 1, wherein the coil has a plurality of windings, forming a spiral structure.

27. The inductor of claim 1, wherein the coil comprises a plurality of windings forming a meandering structure.

28. The inductor of claim 1 wherein each of the first magnetic layer and the second magnetic layer have an effective permeability of from about 10 to about 1000 at an operational frequency of about 500 megahertz.

29. The inductor of claim 1 wherein the first magnetic layer and the second magnetic layer each have a thickness from about 10 to 300 micrometers.

30. A planar inductor comprising:
    a substrate;
    a first flexible magnetic layer comprising a polymer and a plurality of magnetic flakes suspended in the polymer;

a conductive coil disposed on a first portion of the first magnetic layer;

an electrically isolating layer disposed on the conducting coil; and a second magnetic layer comprising a polymer and a plurality of magnetic particles suspended in the polymer, wherein the second magnetic layer is disposed on a second portion of the first magnetic layer and on at least a portion of the conductive coil, wherein each of the magnetic flakes has a thickness of from about 0.1 to about 5 micrometers and a diameter from about 8 to about 200 micrometers, wherein a plurality of the magnetic flakes of at least the first magnetic layer are substantially aligned with respect to each other and a plurality of magnetic flakes of the second magnetic layer are substantially aligned with respect to each other, wherein the first magnetic layer and the second magnetic layer together conform to top, bottom, and side surfaces of at least a portion of the conductive coil, wherein a side surface of the conductive coil and a top surface of the conductive coil form an obtuse angle, and wherein the side surface of the conductive coil is a concave curved surface.

* * * * *